United States Patent
Graybill et al.

(10) Patent No.: US 8,164,897 B2
(45) Date of Patent: Apr. 24, 2012

(54) AIRFLOW RECIRCULATION AND COOLING APPARATUS AND METHOD FOR AN ELECTRONICS RACK

(75) Inventors: David P. Graybill, Staatsburg, NY (US); Madhusudan K Iyengar, Woodstock, NY (US); Jeffrey A. Newcomer, Poughkeepsie, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 12/708,792

(22) Filed: Feb. 19, 2010

(65) Prior Publication Data
US 2011/0205705 A1 Aug. 25, 2011

(51) Int. Cl.
*H05K 7/20* (2006.01)
*F28F 7/00* (2006.01)

(52) U.S. Cl. ......... 361/679.49; 361/679.53; 361/679.48; 361/679.5; 361/690; 361/694; 361/695; 361/696

(58) Field of Classification Search ............. 361/679.53, 361/679.48, 679.49, 679.5, 690, 694, 695, 361/696; 165/80.2
See application file for complete search history.

(56) References Cited

U.S. PATENT DOCUMENTS

| | | | |
|---|---|---|---|
| 5,056,331 A | 10/1991 | Lotz | |
| 6,702,661 B1 | 3/2004 | Clifton et al. | |
| 6,745,759 B2 | 6/2004 | Bossler | |
| 6,746,212 B2 | 6/2004 | Payne | |
| 6,747,872 B1 * | 6/2004 | Patel et al. | 361/695 |
| 6,775,137 B2 | 8/2004 | Chu et al. | |
| 6,819,563 B1 | 11/2004 | Chu et al. | |
| 6,826,922 B2 | 12/2004 | Patel | |
| 6,868,682 B2 * | 3/2005 | Sharma et al. | 62/180 |
| 6,896,612 B1 | 5/2005 | Novotny | |

(Continued)

FOREIGN PATENT DOCUMENTS
JP 2010164218 A * 7/2010

OTHER PUBLICATIONS

Campbell et al., "System and Method for Standby Mode Cooling of a Liquid-Cooled Electronics Rack", U.S. Appl. No. 12/567,954, filed Sep. 28, 2009.

(Continued)

*Primary Examiner* — Anatoly Vortman
(74) *Attorney, Agent, or Firm* — Dennis Jung, Esq.; Kevin P. Radigan, Esq.; Heslin Rothenberg Farley & Mesiti P.C.

(57) ABSTRACT

An apparatus is provided for facilitating cooling of an electronics rack of a data center. The apparatus includes: an airflow director mounted to the electronics rack to redirect airflow exhausting from the electronics rack through an airflow return pathway back towards an air inlet side of the rack; an air-to-liquid heat exchanger disposed within the airflow return pathway for cooling redirected airflow before exiting into the data center near the air inlet side of the rack; an air temperature sensor for monitoring air temperature of the redirected airflow; and an automated isolation door associated with the airflow director for automatically blocking airflow exhausting from the air outlet side of the electronics rack from passing through the airflow return pathway back towards the air inlet side of the rack responsive to temperature of the redirected airflow exceeding a defined temperature threshold.

20 Claims, 13 Drawing Sheets

U.S. PATENT DOCUMENTS

| | | | |
|---|---|---|---|
| 6,924,981 B2 | 8/2005 | Chu et al. | |
| 7,104,081 B2 | 9/2006 | Chu et al. | |
| 7,120,021 B2 | 10/2006 | Hamman | |
| 7,177,148 B2 | 2/2007 | Nakata et al. | |
| 7,184,269 B2 | 2/2007 | Campbell et al. | |
| 7,203,063 B2 | 4/2007 | Bash et al. | |
| 7,209,351 B2* | 4/2007 | Wei | 361/695 |
| 7,283,358 B2 | 10/2007 | Campbell et al. | |
| 7,319,594 B2 | 1/2008 | Nicolai et al. | |
| 7,349,213 B2 | 3/2008 | Campbell et al. | |
| 7,385,810 B2 | 6/2008 | Chu et al. | |
| 7,397,661 B2 | 7/2008 | Campbell et al. | |
| 7,403,391 B2 | 7/2008 | Germagian et al. | |
| 7,477,514 B2 | 1/2009 | Campbell et al. | |
| 7,500,911 B2* | 3/2009 | Johnson et al. | 454/184 |
| 7,534,167 B2 | 5/2009 | Day | |
| 7,542,287 B2* | 6/2009 | Lewis et al. | 361/695 |
| 7,584,459 B2 | 9/2009 | Bonsteel et al. | |
| 7,643,291 B2* | 1/2010 | Mallia et al. | 361/695 |
| 2003/0053293 A1* | 3/2003 | Beitelmal et al. | 361/687 |
| 2003/0067745 A1* | 4/2003 | Patel et al. | 361/690 |
| 2004/0065097 A1* | 4/2004 | Bash et al. | 62/180 |
| 2004/0090729 A1* | 5/2004 | Beitelmal et al. | 361/103 |
| 2004/0100770 A1* | 5/2004 | Chu et al. | 361/698 |
| 2004/0217072 A1* | 11/2004 | Bash et al. | 211/26 |
| 2005/0237716 A1 | 10/2005 | Chu et al. | |
| 2005/0278069 A1* | 12/2005 | Bash et al. | 700/276 |
| 2006/0168975 A1* | 8/2006 | Malone et al. | 62/180 |
| 2006/0172685 A1 | 8/2006 | O'Brien | |
| 2006/0199508 A1* | 9/2006 | Nair et al. | 454/237 |
| 2007/0171609 A1 | 7/2007 | Kehl et al. | |
| 2007/0236881 A1 | 10/2007 | Harder et al. | |
| 2008/0055846 A1* | 3/2008 | Clidaras et al. | 361/687 |
| 2008/0158815 A1 | 7/2008 | Campbell et al. | |
| 2008/0163631 A1 | 7/2008 | Campbell et al. | |
| 2008/0266794 A1* | 10/2008 | Malone | 361/695 |
| 2009/0050591 A1 | 2/2009 | Hart et al. | |
| 2009/0056910 A1* | 3/2009 | Mallia et al. | 165/80.3 |
| 2009/0059523 A1* | 3/2009 | Mallia et al. | 361/695 |
| 2009/0072541 A1 | 3/2009 | Van Harselaar | |
| 2009/0080173 A1 | 3/2009 | Porter et al. | |
| 2009/0086428 A1 | 4/2009 | Campbell et al. | |
| 2009/0086432 A1 | 4/2009 | Campbell et al. | |
| 2009/0150133 A1* | 6/2009 | Archibald et al. | 703/9 |
| 2009/0156114 A1 | 6/2009 | Ahladas et al. | |
| 2009/0268404 A1 | 10/2009 | Chu et al. | |

OTHER PUBLICATIONS

Campbell et al., "Apparatus and Method for Facilitating Cooling of an Electronics Rack", U.S. Appl. No. 12/565,189, filed Sep. 23, 2009.

Barringer et al., "Apparatus and Method for Adjusting Coolant Flow Resistance Through Liquid-Cooled Electronics Rack(s)", U.S. Appl. No. 12/556,040, filed Sep. 29, 2009.

Office Action for U.S. Appl. No. 11/862,328 dated Oct. 20, 2009.

* cited by examiner

AIRFLOW RECIRCULATION AND COOLING APPARATUS AND METHOD FOR AN ELECTRONICS RACK

BACKGROUND

The present invention relates in general to facilitating air cooling of one or more electronics racks of a data center, including rack mounted assemblages of individual electronics units, such as rack-mounted computer server units.

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (e.g., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn across the top of the rack into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

BRIEF SUMMARY

In one aspect, the shortcomings of the prior art are overcome and additional advantages are provided through the provision of an apparatus for facilitating cooling of an electronics rack of a data center. The apparatus includes: an airflow director; at least one air-to-liquid heat exchange assembly; at least one air temperature sensor; and an automated isolation door. The airflow director is configured for an electronics rack, wherein air moves through the electronics rack from an air inlet side to an air outlet side thereof, and wherein the airflow director is configured to redirect airflow exhausting from the electronics rack at the air outlet side of the rack via an airflow return pathway back towards the air inlet side of the electronics rack, the airflow return pathway being configured for redirected airflow to exit the airflow return pathway into the data center to mix with air of the data center at the air inlet side of the electronics rack. The at least one air-to-liquid heat exchange assembly is disposed within the airflow return pathway for cooling redirected airflow exhausting from the air outlet side of the electronics rack before exiting into the data center to mix with air of the data center at the air inlet side of the electronics rack. The at least one air temperature sensor is provided for monitoring air temperature of the redirected airflow, and the automated isolation door is associated with the airflow director for automatically blocking airflow exhausting from the air outlet side of the electronics rack from passing through the airflow return pathway back towards the air inlet side of the electronics rack responsive to temperature of the redirected airflow exceeding a defined temperature threshold.

In another aspect, a cooled electronics system for a data center is provided, which includes an electronics rack and an apparatus for facilitating cooling of the electronics rack. The electronics rack comprises: an air inlet side and an air outlet side, the air inlet side and the air outlet side respectively enabling ingress and egress of external air; at least one electronics subsystem requiring cooling; and at least one air moving device, the at least one air moving device causing external air to flow from the air inlet side of the electronics rack, across the at least one electronics subsystem to the air outlet side of the electronics rack. The apparatus for cooling the electronics rack comprises: an airflow director; at least one air-to-liquid heat exchange assembly; at least one air temperature sensor; and an automated isolation door. The airflow director is mounted to the electronics rack to redirect airflow exhausting from the electronics rack at the air outlet side thereof through an airflow return pathway back towards the air inlet side of the electronics rack, wherein the airflow return pathway is configured for directing airflow to exit the airflow return pathway into the data center to mix with air of the data center at the air inlet side of the electronics rack. The at least one air-to-liquid heat exchange assembly is disposed within the airflow return pathway for cooling redirected airflow exhausting from the air outlet side of the electronics rack before exiting into the data center to mix with air of the data center at the air inlet side of the electronics rack. The at least one air temperature sensor is position for monitoring air temperature of the redirected airflow, and the automated isolation door is associated with the airflow director for automatically blocking airflow exhausting from the air outlet side of the electronics rack from passing through the airflow return pathway back towards the air inlet side of the electronics rack responsive to temperature of the redirected airflow exceeding a defined temperature threshold.

In a further aspect, a method of facilitating cooling of an electronics rack is provided. The method includes: providing an airflow director configured for the electronics rack, wherein air moves through the electronics rack from an air inlet side to an air outlet side thereof, and wherein the airflow director is configured to redirect airflow exhausting from the electronics rack at the air outlet side thereof via an airflow return pathway back towards the air inlet side of the electronics rack, wherein the airflow return pathway is configured for redirecting airflow to exit the airflow return pathway into the data center to mix with air of the data center at the air inlet side of the electronics rack; disposing at least one air-to-liquid heat exchange assembly within the airflow return pathway for cooling redirected airflow exhausting from the air outlet side of the electronics rack before exiting into the data center to mix with air of the data center at the air inlet side of the electronics rack; providing at least one air temperature sensor for monitoring air temperature of the redirected airflow; and mounting an automated isolation door to the airflow director for automatically blocking airflow exhausting from the air outlet side of the electronics rack from passing through the airflow return pathway back towards the air inlet side of the electronics rack responsive to temperature of the redirected airflow exceeding a predefined temperature threshold.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
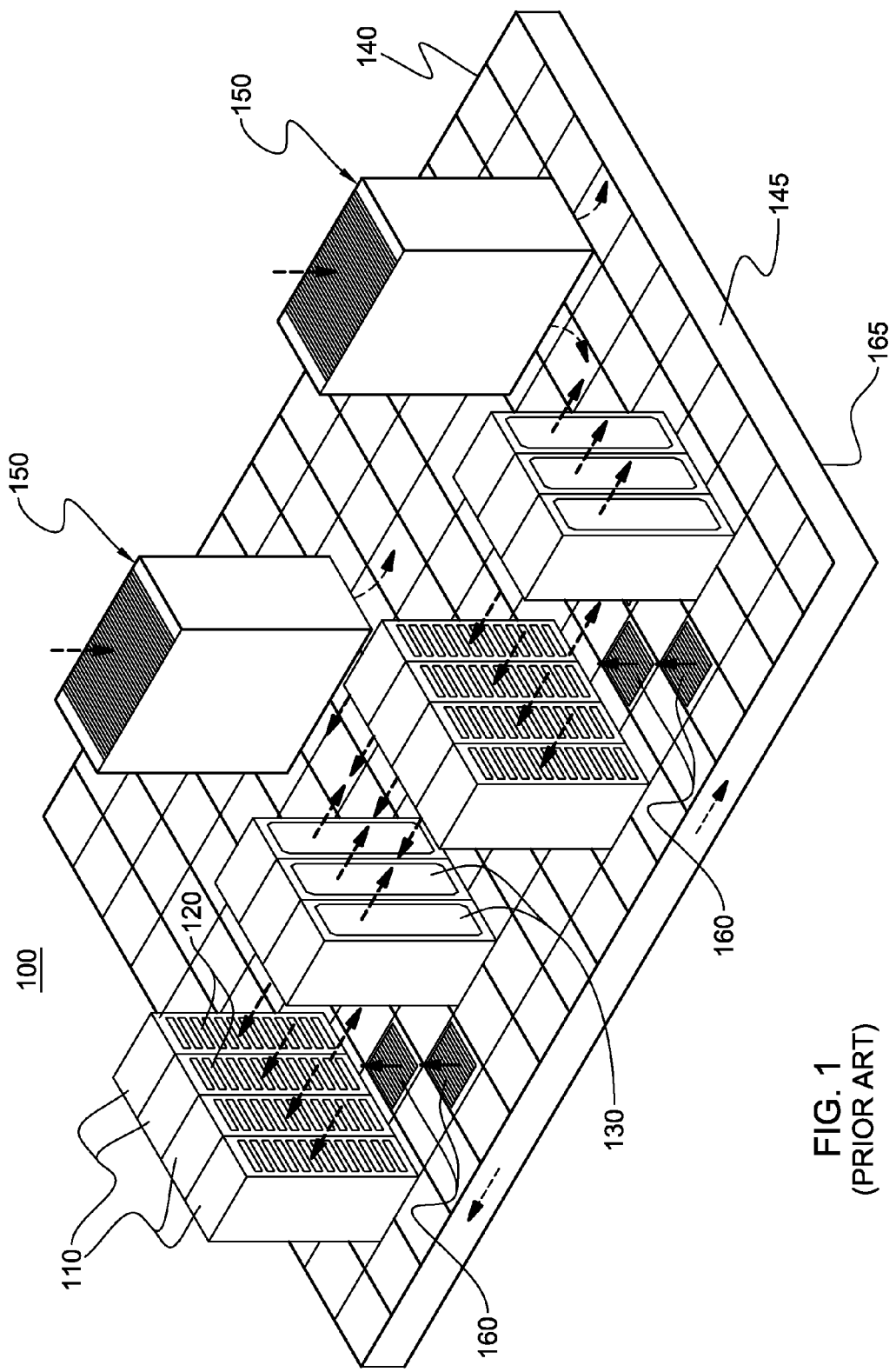
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
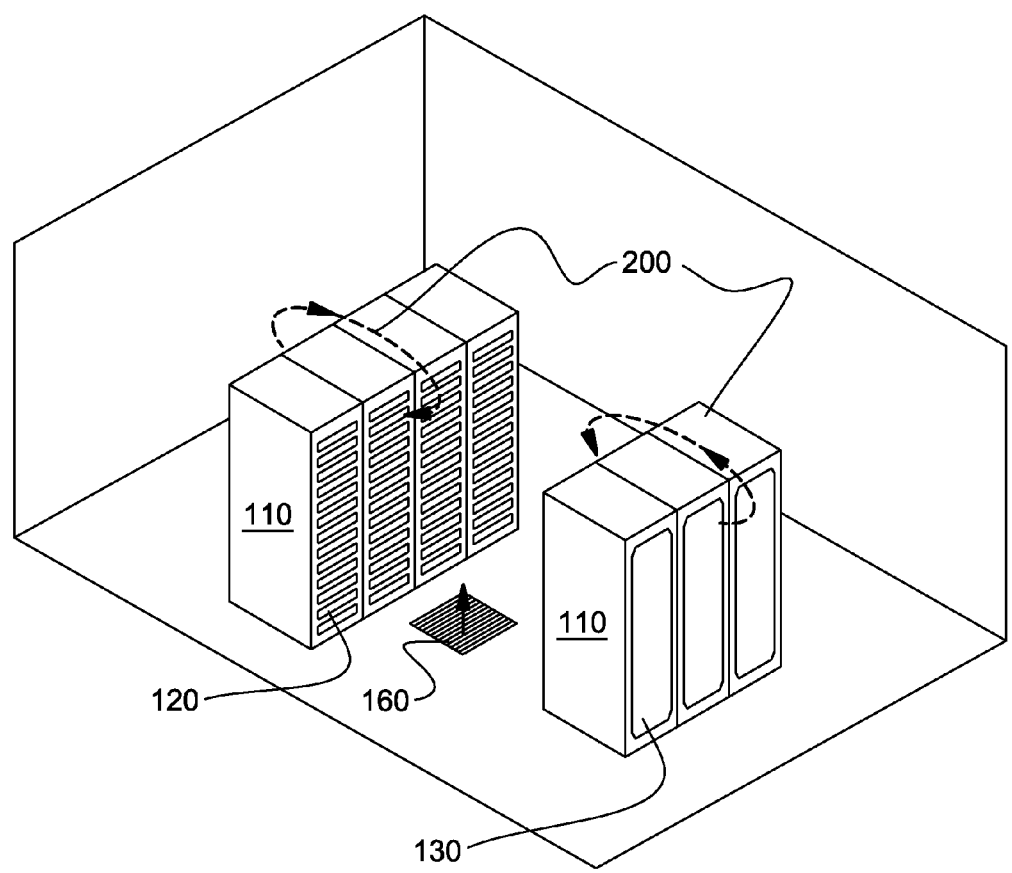
FIG. 2 depicts one problem addressed by the present invention showing recirculation airflow patterns in one implementation of a raised floor layout of air cooled data center.

Due to the ever increasing airflow requirements through electronics racks, and limits of air distribution within the typical data center installation, re-circulation problems within the room may occur. This is shown in FIG. 2 for a raised floor layout, wherein hot air re-circulation 200 occurs from the air outlet sides 130 of the electronics racks 110 back across the tops of the racks to the cold air aisle defined by the opposing air inlet sides 120 of the electronics rack. This re-circulation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through re-circulation 200. This recirculating flow is often very complex in nature, and can lead to significantly higher rack unit inlet temperatures than desired.

The re-circulation of hot exhaust air from the hot aisle of the computer room installation to the cold aisle can be detrimental to the performance and reliability of the computer system(s) or electronic system(s) within the racks. Airflow distribution within a data center has a major impact on the thermal environment of the equipment located within the data center. A significant requirement of manufacturers is that the inlet temperature and humidity to the electronic equipment be maintained within specifications. For a class 1 datacom environment as specified by ASHRAE, the allowable inlet air temperature is in the range of 15-32° C., while the relative humidity is between 20-80%. Higher elevations require a de-rating of the maximum dry bulb temperature of 1° C. for every 300 m above an elevation of 900 m up to a maximum elevation of 3050 m. These temperatures/humidity requirements are to be maintained over the entire air inlet area of the rack. Three other class environments specified by ASHRAE generally have a wider range of environmental requirements.

For a raised floor layout such as depicted in FIG. 1, temperatures can range from 10-15° C. at the lower portion of the rack, close to the cooled air input floor vents, to as much as 35-40° C. at the upper portion of the electronics rack, where the hot air can form a self-sustaining re-circulation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is of significant importance, from a product reliability and performance view point, and from a customer satisfaction and business perspective, to limit the temperature of the inlet air to the rack unit to be substantially uniform. The efficient cooling of such computer and electronic systems, and the amelioration of localized hot air inlet temperatures to one or more rack units due to re-circulation of air currents, are addressed by the apparatuses and methods disclosed herein.

Figure 3A:
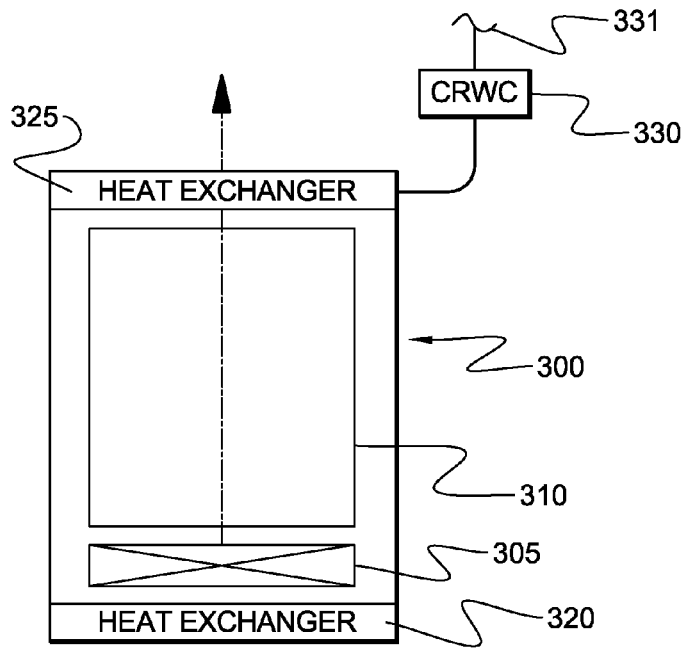
FIG. 3A is a cross-sectional plan view of one embodiment of an electronics rack using attached air-to-liquid heat exchangers to enhance cooling of air passing through the electronics rack.
Figure 3B:
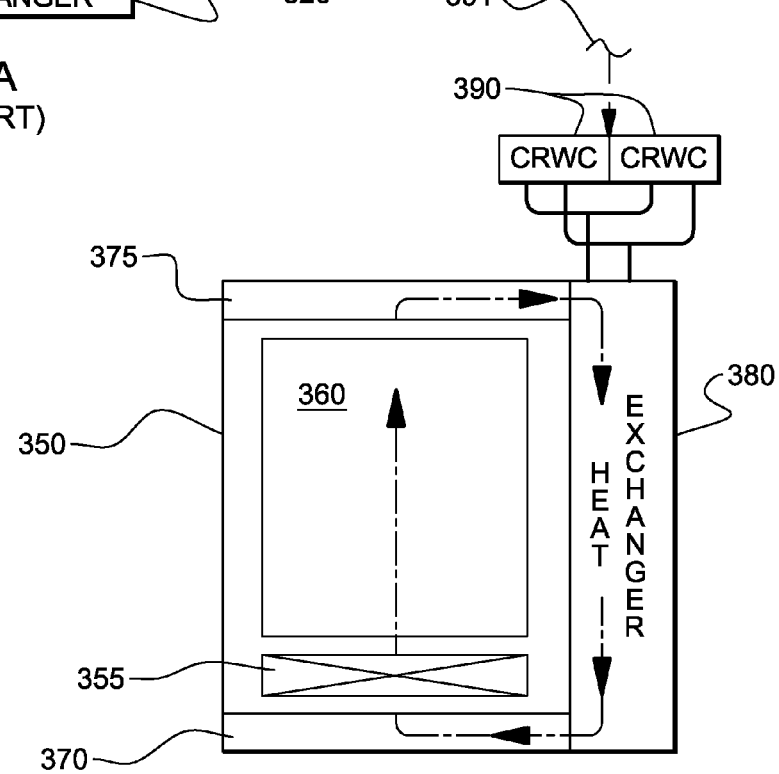
FIG. 3B is a cross-sectional plan view of another embodiment of an electronics rack using an attached air-to-liquid heat exchanger to enhance cooling of air passing through the electronics rack.

FIGS. 3A and 3B depict prior rack level water cooled solutions which utilize chilled facility water to remove heat from the computer installation room, thereby transferring the cooling burden from the air-conditioning units to the building chilled water coolers. The embodiment of FIG. 3A is described in detail in commonly assigned U.S. Pat. No. 6,819,563, while the embodiment of FIG. 3B is described in detail in commonly assigned U.S. Pat. No. 6,775,137, both of which are incorporated herein by reference in their entirety. Briefly summarized, both embodiments utilize a computer room water conditioning unit 330 (FIG. 3A), 390 (FIG. 3B) (fed with facility chilled water 331 (FIG. 3A), 391 (FIG. 3B)), which circulates chilled coolant through one or more heat exchangers coupled to individual electronics racks 300, 350 within the computer room.

In the embodiment of FIG. 3A, electronics rack 300 has an inlet heat exchanger 320 and/or an outlet heat exchanger 325 attached to the rack. Airflow across one or more electronics drawers 310 is forced via one or more air moving devices 305. Each heat exchanger 320, 325 covers the complete airflow paths from front to back, with the air intake being chilled by heat exchanger 320, and the heated exhaust chilled by heat exchanger 325. Thus, the inlet-to-outlet airflow paths through the rack unit each pass through the same sequence of heat exchangers.

In FIG. 3B, rack unit 350 again includes one or more air moving devices 355 for moving airflow from an air inlet side to an air outlet side across one or more drawer units 360 containing the heat generating components. In this embodiment, a front cover 370 attached to the rack covers the air inlet side, a back cover 375 attached to the rack covers the air outlet side thereof, and a side car attached to the rack includes a heat exchanger 380 for cooling of the air circulating through the rack unit. Further, in this embodiment, multiple computer room water conditioning (CRWC) units 390 receive building or facility chilled water 391, which is then used to cool coolant circulating through heat exchanger 380. The rack unit in this example is assumed to comprise a substantially enclosed housing wherein the same air circulates through the housing and passes across the heat exchanger 380.

By way of further enhancement, disclosed herein are alternate airflow recirculation and cooling apparatuses and methods which ameliorate localized hot air temperatures at one or more rack units due to recirculating air currents. In the embodiments disclosed herein, the hot exhaust air from the air outlet side of the electronics rack is cooled and redirected to the air inlet side of the electronics rack to exhaust into the cold air aisle of the data center. At this location, the redirected airflow mixes with the air of the data center and is drawn back into the air inlet side of the electronics rack. Note that, the apparatuses and methods disclosed herein may be used in a data center wherein substantially all heat is extracted from the air via the air-to-liquid heat exchange assemblies of the apparatuses, or can be used in combination with a conventional air cooled data center, such as in an air cooled raised floor data center, wherein the cold air aisle includes perforated floor tiles through which cold air is forced by the air conditioning unit(s) of the data center.

Advantageously, and as explained further below, the airflow recirculation and cooling apparatuses and methods disclosed herein employ a controller, which facilitates a plurality of functions. For example, one or more temperature sensors are employed to monitor air temperature of the redirected airflow within the airflow return pathway, and responsive to this monitoring, an isolation door associated with an airflow director of the apparatus may be automatically transitioned to block airflow exhausting from the air outlet side of the electronics rack from passing through the airflow return pathway back towards the air inlet side of the electronics rack. In one embodiment, this might occur responsive to the sensed temperature of the redirected airflow exceeding a predefined temperature threshold. Additionally, the controller may automatically transition the isolation door to block exhaust airflow from the air outlet side of the electronics rack from passing through the airflow return pathway should a leak be detected in the one or more air-to-liquid heat exchange assemblies within the airflow return pathway.

One or more passive power sources may be employed to power the controller. For example, the controller may be powered by photovoltaic cells disposed within the data center, or by a micro wind turbine(s) disposed within the electronics rack or within the airflow return pathway of the apparatus. Advantageously, the apparatus and methods disclosed herein may either supplement conventional air cooling of a data center, or replace the air cooling of the data center, depending on the requirements of the implementation. Further, the apparatuses and methods disclosed herein, particularly when used as a supplement to conventional air cooling, allow the associated electronics rack to continue operation notwithstanding detection of a problem with the one or more heat exchange assemblies within the airflow return pathway of the apparatus.

Figure 4:
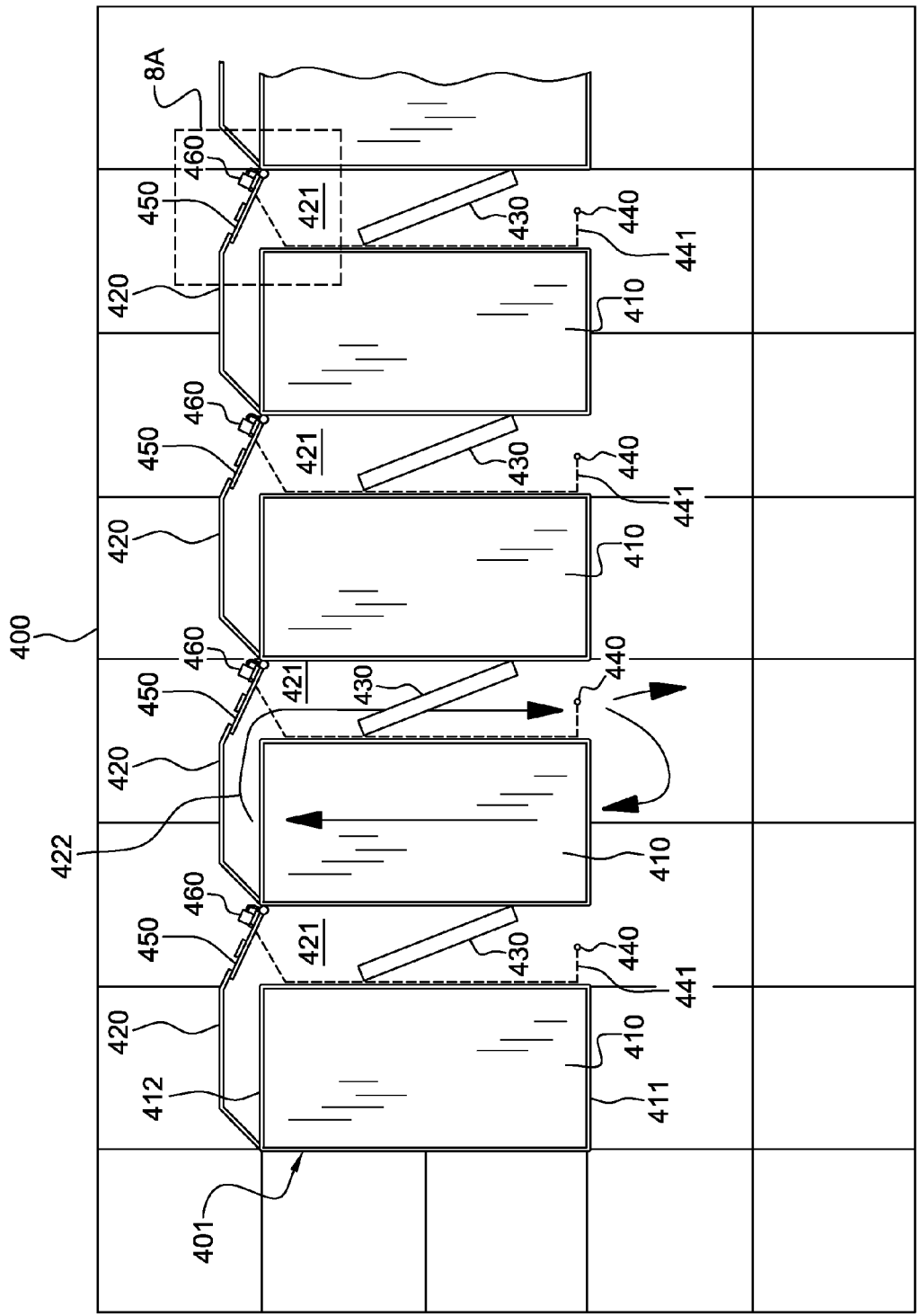
FIG. 4 is a plan view of one embodiment of a data center comprising multiple cooled electronics systems, each comprising an electronics rack and an associated airflow recirculation and cooling apparatus, in accordance with an aspect of the present invention.

FIG. 4 is a plan view of a data center floor 400. In one embodiment, data center floor 400 is a raised floor implementation comprising perforated tiles (not shown) in a cold air aisle of the data center adjacent to the air inlet sides of the electronics racks, shown arranged in a row. In such an implementation, air cooling of the rack units is provided by one or more air conditioning units (not shown) of the data center.

In FIG. 4, data center floor 400 has disposed thereon multiple cooled electronics systems 401, in accordance with aspects of the present invention. Each cooled electronics system 401 comprises (in one embodiment) an air cooled electronics rack 410 and an open loop, airflow recirculation and cooling apparatus for redirecting and cooling exhausting air of the electronics rack 410. As illustrated, each electronics rack 410 includes an air inlet side 411 and an air outlet side 412, which respectively enable ingress and egress of external air. In addition, each electronics rack includes one or more electronics subsystems requiring cooling, and one or more air moving devices (not shown), which cause external air to flow from air inlet side 411, across the one or more electronics subsystems thereof to air outlet side 412. The airflow recirculation and cooling apparatus of the present invention is shown to define an open loop wherein airflow 422 exhausting from electronics rack 410 at the air outlet side 412 thereof is redirected via an airflow redirector 420 through an airflow return pathway 421, across an air-to-liquid heat exchange assembly 430, before exiting back into the data center to mix with air of the data center near air inlet side 411 of electronics rack 410. As shown, a portion of the redirected airflow exiting back into the data center is drawn back into the air inlet side 411 of electronics rack 410 to repeat the process. Note that the hot exhaust air from the air outlet side of the electronics rack is turned 180° in the airflow return pathway and flows along a side of the electronics rack extending transverse to air inlet side 411 and air outlet side 412 thereof.

As shown in FIG. 4, the airflow recirculation and cooling apparatus further includes one or more temperature sensors 440 for monitoring air temperature of the redirected airflow, and an automated isolation door 450 associated with airflow director 420 to automatically, selectively block airflow exhausting from air outlet side 412 of electronics rack 410 from passing through airflow return pathway 421 back towards air inlet side 411 of the electronics rack. This later aspect of Applicants' invention is described further below with reference to FIGS. 8A-9C. As shown, temperature sensor(s) 440 connects via one or more communications lines 441 back to a control unit 460, which controls (via a latching mechanism) position of the automated isolation door, as described further below. By way of example, the one or more temperature sensors might comprise one or more thermistors.

Note that various embodiments of the airflow recirculation and cooling apparatus conceptually depicted in FIG. 4 are possible. FIGS. 5A-11 illustrate in detail one example of such an apparatus. One or more variations to this apparatus may be possible, without departing from the scope of the present invention. For example, less than all air egressing from the air outlet side of the electronics rack may be redirected into the airflow return pathway, depending on the requirements of the implementation. This could be achieved by providing one or more exposed openings in the airflow director 420 sufficient to allow a desired amount of air to egress through the apparatus adjacent to the air outlet side of the electronics rack. The embodiment of FIGS. 5A-11 assumes that substantially all air egressing from the air outlet side of an electronics rack is redirected through the airflow return pathway of the apparatus back towards to the air inlet side of the electronics rack during normal operation.

Figure 5B:
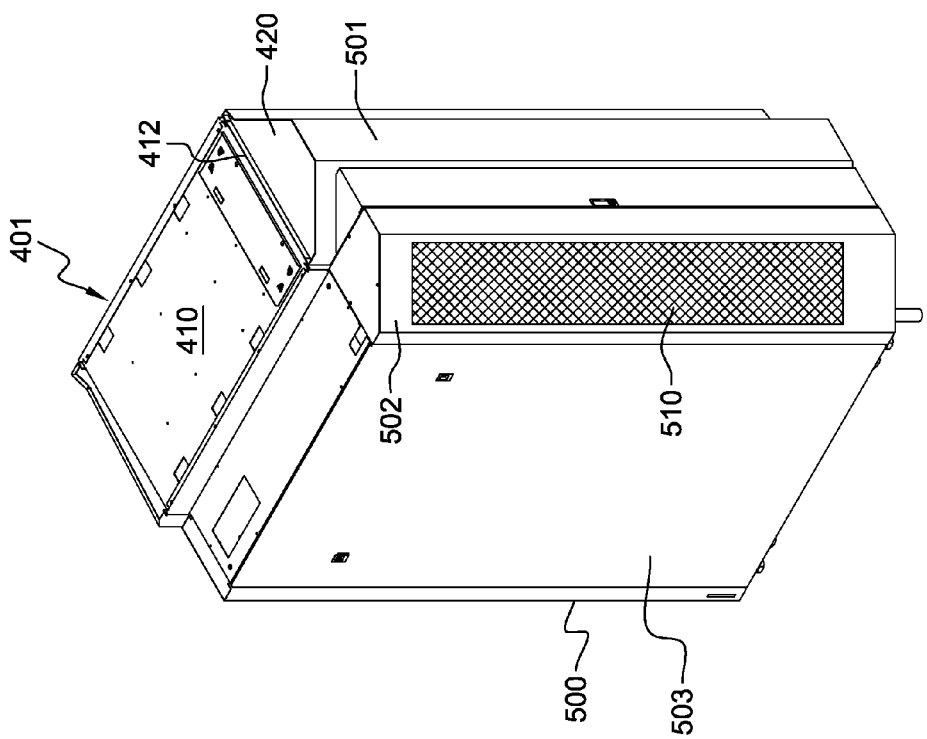
FIG. 5B is an isometric view of the cooled electronics system of FIG. 5A, viewed from an air outlet side of the electronics rack, in accordance with an aspect of the present invention.
Figure 5A:
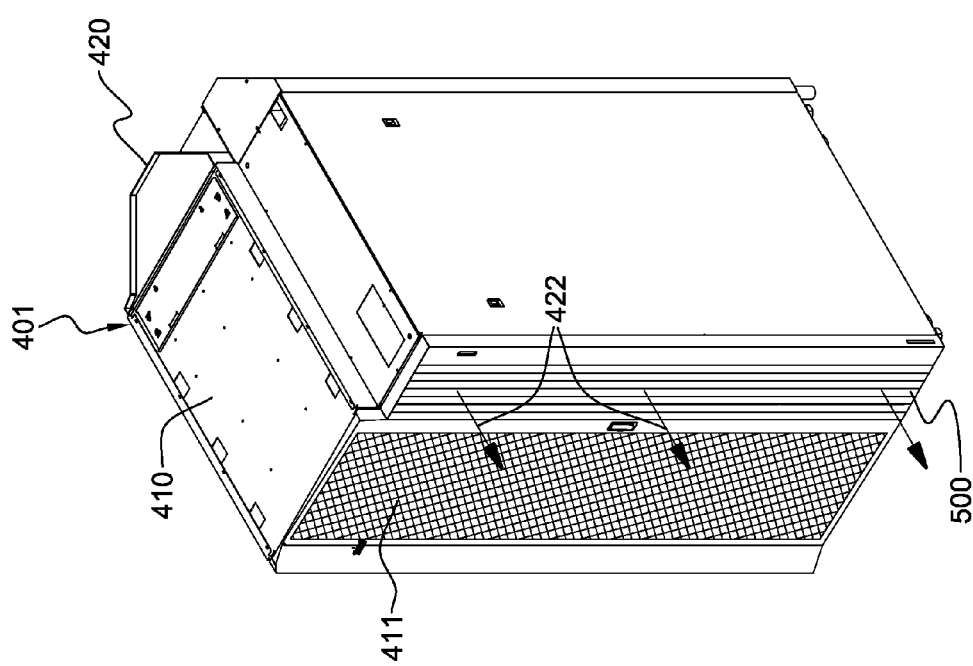
FIG. 5A is an isometric view of one embodiment of a cooled electronics system, viewed from an air inlet side of the electronics rack, in accordance with an aspect of the present invention.

FIGS. 5A & 5B illustrate one detailed embodiment of a cooled electronics system 401, in accordance with an aspect of the present invention. In FIG. 5A, cooled electronics system 401 is shown viewed from air inlet side 411 of electronics rack 410, while in FIG. 5B, cooled electronics system 401 is shown viewed from air outlet side 412 of the rack. As illustrated in FIG. 5A, the airflow recirculatation and cooling apparatus includes, in one embodiment, an airflow exhaust cover 500, which is disposed adjacent to air inlet side 411 of electronics rack 410 for allowing the redirected airflow 422 to exit into the data center adjacent to the air inlet side of the rack. In one embodiment, this airflow exhaust cover may comprise a plurality of vertically oriented elongate slots through which the airflow passes. One or more louvers in the airflow exhaust cover may be provided to, for example, further direct the airflow from the airflow return pathway into the data center towards in front of the air inlet side of the electronics rack.

As illustrated in FIGS. 5A, and more particularly in FIG. 5B, airflow director 420 comprises, in part, an outlet door section 501, a corner section 502, and a side section 503. Corner section 502 comprises one or more exhaust openings 510, and side section 503 comprises one or more air-to-liquid heat exchange assemblies (not shown). In FIG. 5B, automated isolation door is in a first, normal operation position, wherein exhaust airflow from the air outlet side of the electronics rack is redirected through the airflow return pathway to exit into the data center through airflow exhaust cover 500. In this first position, the isolation door blocks the redirected airflow from passing through the one or more exhaust openings 510 in corner section 502 of airflow director 420.

Figure 6B:
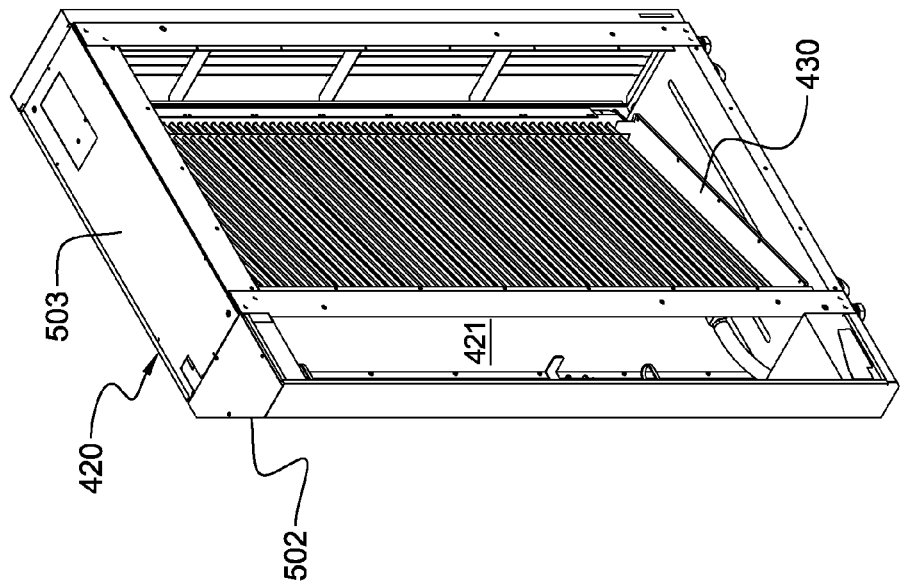
FIG. 6B depicts the structure of FIG. 6A, with the side blanking panel removed to illustrate on embodiment of the air-to-liquid heat exchange assembly, in accordance with an aspect of the present invention
Figure 6A:
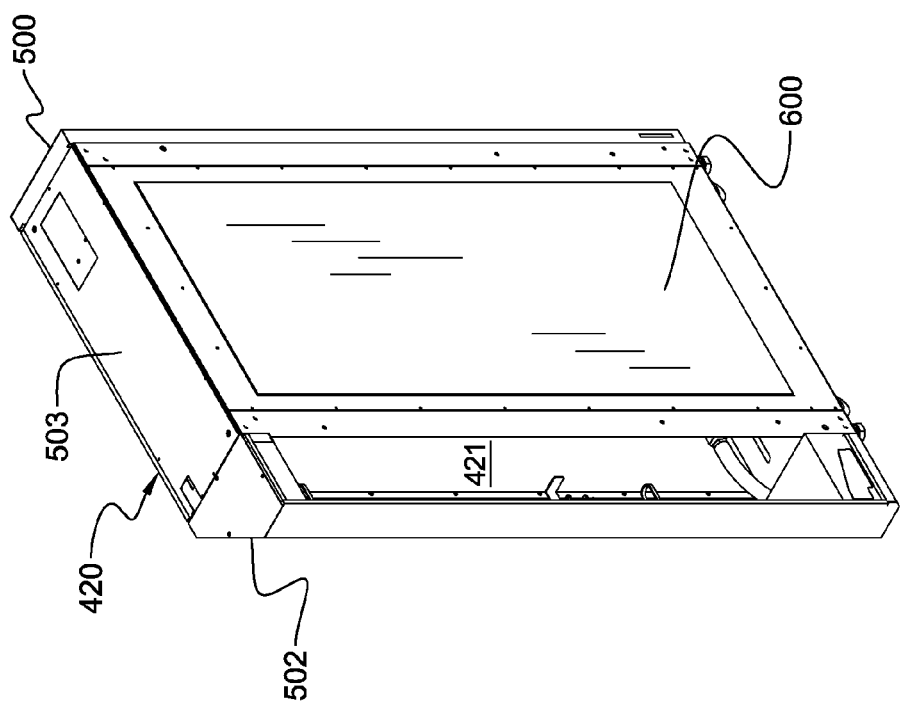
FIG. 6A is a partial depiction of an apparatus for facilitating rack airflow recirculation and cooling, and illustrating a portion of the airflow return pathway, in accordance with an aspect of the present invention.

FIGS. 6A & 6B are partial depictions of the airflow recirculation and cooling apparatus of FIGS. 5A & 5B, illustrating one embodiment of the inside of corner section 502 and side section 503 of airflow director 420. As illustrated, the airflow return pathway 421 is shown to be defined by and extend through corner section 502 and side section 503 for ultimately directing exhaust airflow through airflow exhaust cover 500 back into the data center. In FIG. 6A, a blanking panel 600 is illustrated on one side of side section 503 to assist in defining airflow return pathway 421, while in FIG. 6B, blanking panel 600 is removed to illustrate one embodiment of the air-to-liquid heat exchange assembly 430. In this embodiment, the heat exchange assembly is shown to be at an angle within side section 503, extending from one inner wall to the other inner wall, such that redirected airflow passing through airflow return pathway 421 necessarily passes across air-to-liquid heat exchange assembly 430 for extraction of heat from the air via a liquid coolant, such as a facility coolant of the data center, passing through the air-to-liquid heat exchange assembly.

Figure 7:
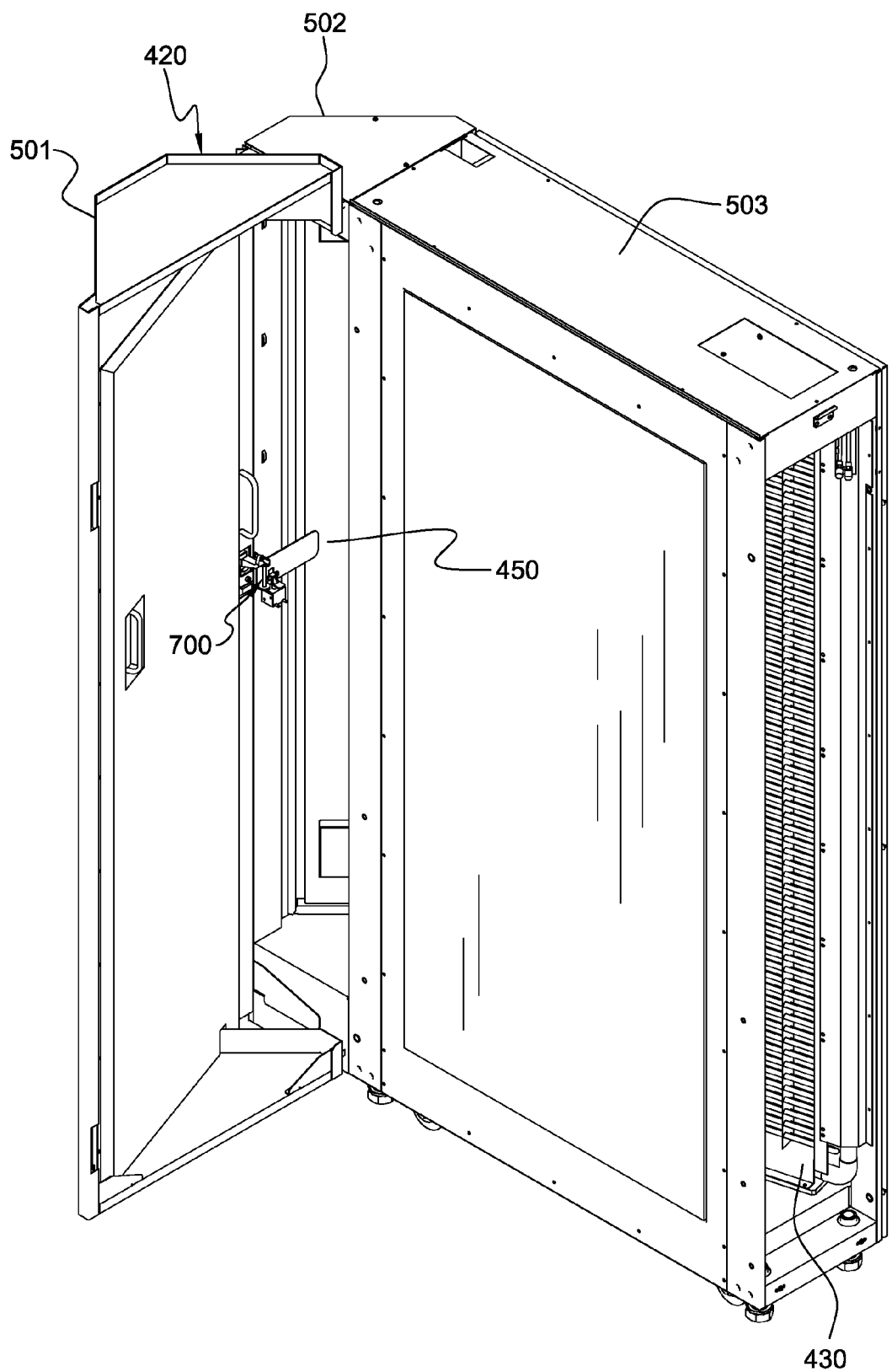
FIG. 7 is an isometric view of only the airflow recirculation and cooling apparatus of FIGS. 5A & 5B, with the redirected airflow exhaust cover removed, in accordance with an aspect of the present invention.

FIG. 7 is an isometric view of the airflow recirculation and cooling apparatus of FIGS. 5A-6B, and illustrating air outlet door section 501, corner section 502 and side section 503 of airflow director 420. Note that in FIG. 7, the airflow exhaust cover adjacent to the air inlet side of the electronics rack (not shown) has been removed to expose air-to-liquid heat exchange assembly 430 within side section 503 of the apparatus. Also partially depicted in this figure is automated isolation door 450, and a latching mechanism 700. In one embodiment, latching mechanism 700 may be controlled by a controller (not shown) to automatically transition the isolation door between its first position illustrated in FIG. 7, and a second position, as described further below with reference to FIGS. 8A & 8B.

Figure 8B:
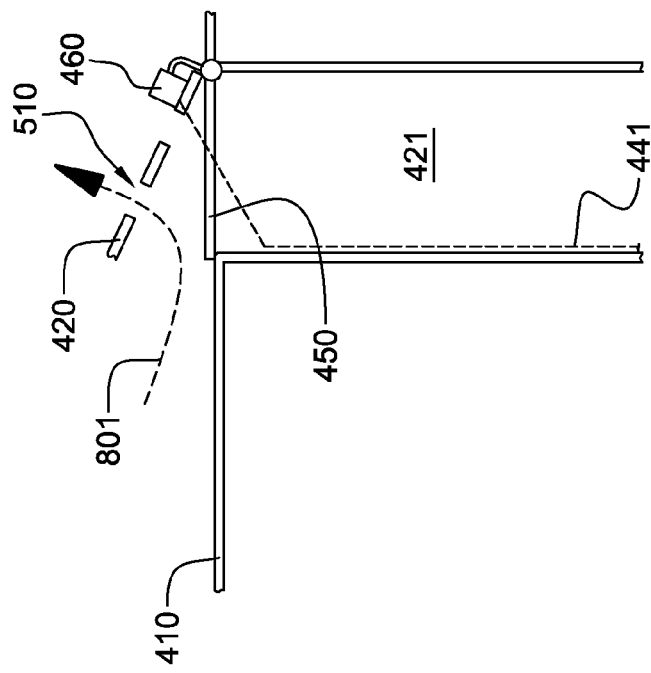
FIGS. 8A & 8B are partial illustrations of one cooled electronics system of FIG. 4, taken along line 8A, wherein the automated isolation door is shown in a first position in FIG. 8A, allowing recirculation of exhaust airflow through the airflow return pathway, and in a second position in FIG. 8B, where the door blocks recirculation of exhaust airflow through the airflow return pathway, in accordance with an aspect of the present invention.
Figure 8A:
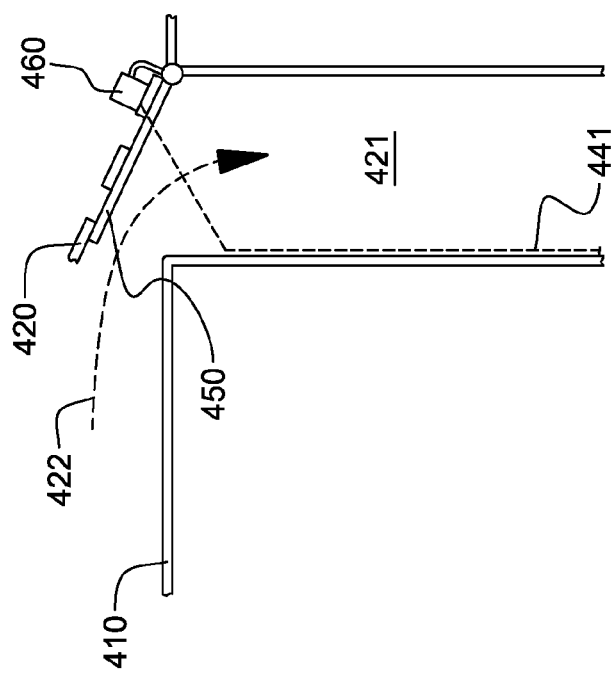

FIGS. 8A & 8B illustrate one operational embodiment of automated isolation door 450, in accordance with an aspect of the present invention. In FIG. 8A, electronics rack 410 is illustrated, wherein exhaust airflow 422 egressing from the air outlet side thereof is redirected by airflow director 420 through airflow return pathway 421 as described above. As shown, automated isolation door 450 is disposed in the corner section of airflow director 420. In one embodiment, automated isolation door 450 is spring biased and hingedly mounted to the corner section of the airflow director to facilitate transitioning of the isolation door from its first position (illustrated in FIG. 8A), to its second position (illustrated in FIG. 8B). In the first position, exhaust airflow 422 passes through airflow return pathway 421 towards the air inlet side of the electronics rack, while in the second position, exhaust airflow 422 passes through the one or more exhaust openings 510 in airflow director 420 to exhaust into the data center near the air outlet side of the electronics rack.

In one implementation, control unit 460 is provided to control transition of the isolation door from its first position to its second position, for example, responsive to detection of an over temperature condition of the redirected airflow, or to a coolant leak in the air-to-liquid heat exchange assembly. By way of example, the isolation door may be spring biased towards its second position, and held in its first position via a latching mechanism, such as described below with reference to FIGS. 9A-9C. Note that control unit 460 may be disposed at any convenient location in the apparatus or the respective electronics rack. Placement of control unit 460 at the corner section of the airflow director is provided by way of example only. Also shown in FIGS. 8A & 8B is the communications line 441 which extends from the one or more temperature sensors (not shown), disposed, for example, near the airflow exhaust cover of the apparatus. If a temperature sensor in the airflow return pathway senses air temperature above a predefined temperature threshold, then the control unit is configured to automatically transition the isolation door from its first position to its second position. Note that a further feature of this apparatus is that the location of the temperature measurement is remote from the location at which the isolation door transitions to close off redirected airflow from passing through the airflow return pathway.

Figure 9A:
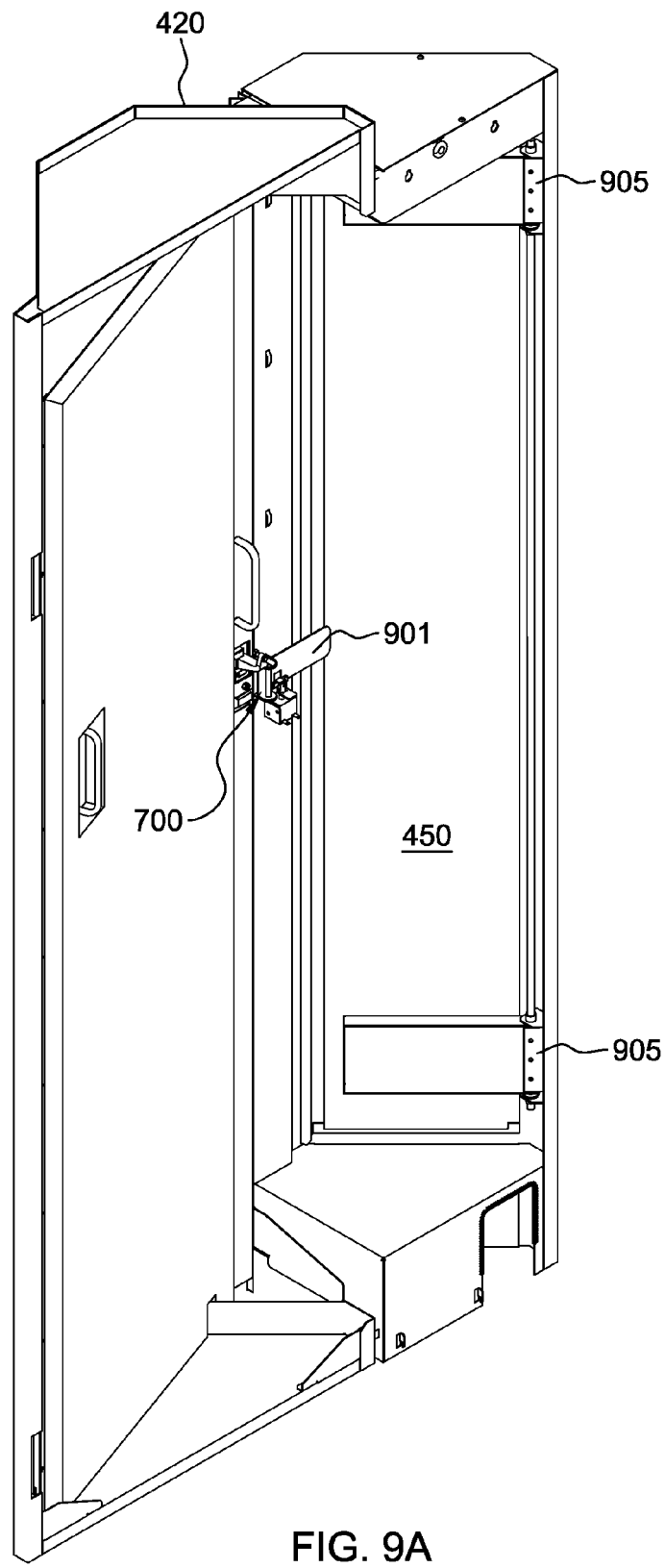
FIGS. 9A & 9B are partial isometric views of one embodiment of an airflow recirculation and cooling apparatus, with the automated isolation door shown in the first position in FIG. 9A, and in the second position in FIG. 9B, in accordance with an aspect of the present invention.
Figure 9B:
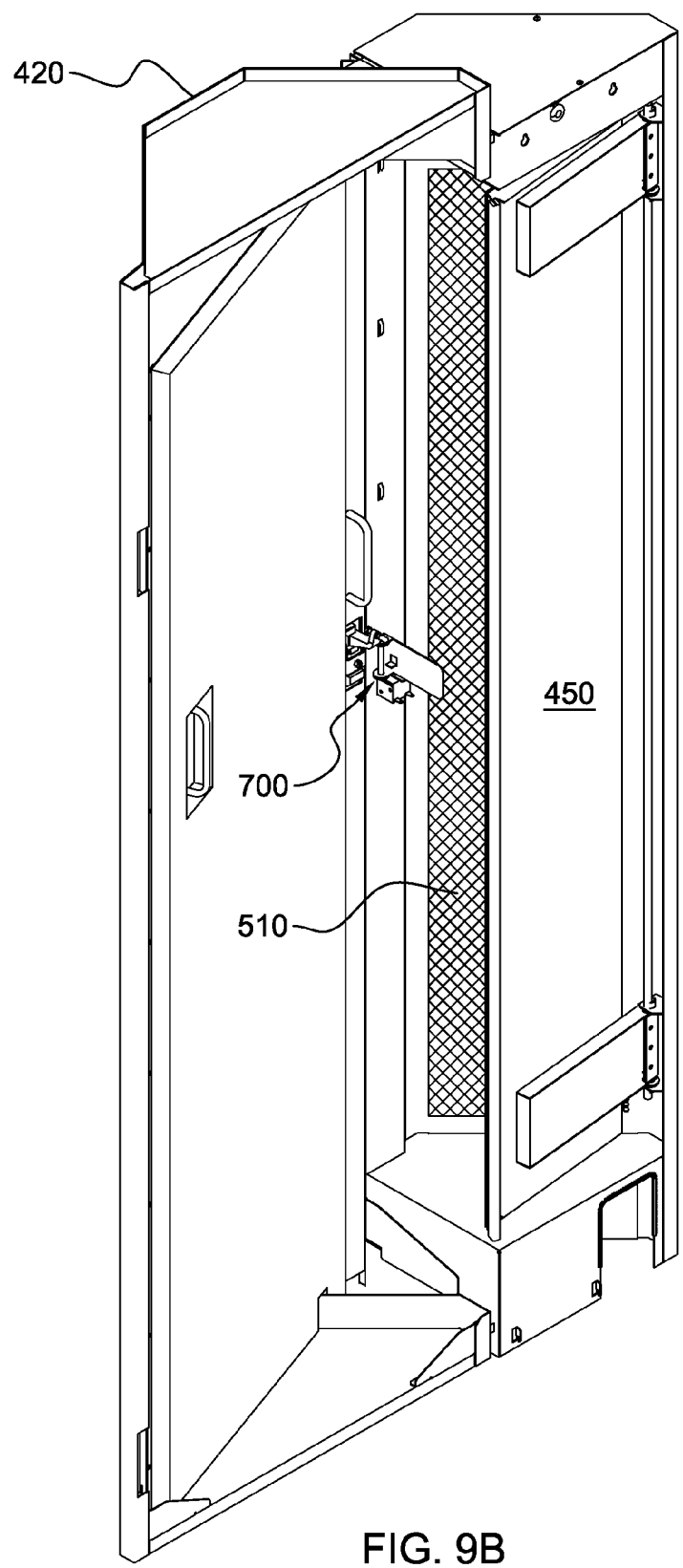
Figure 9C:
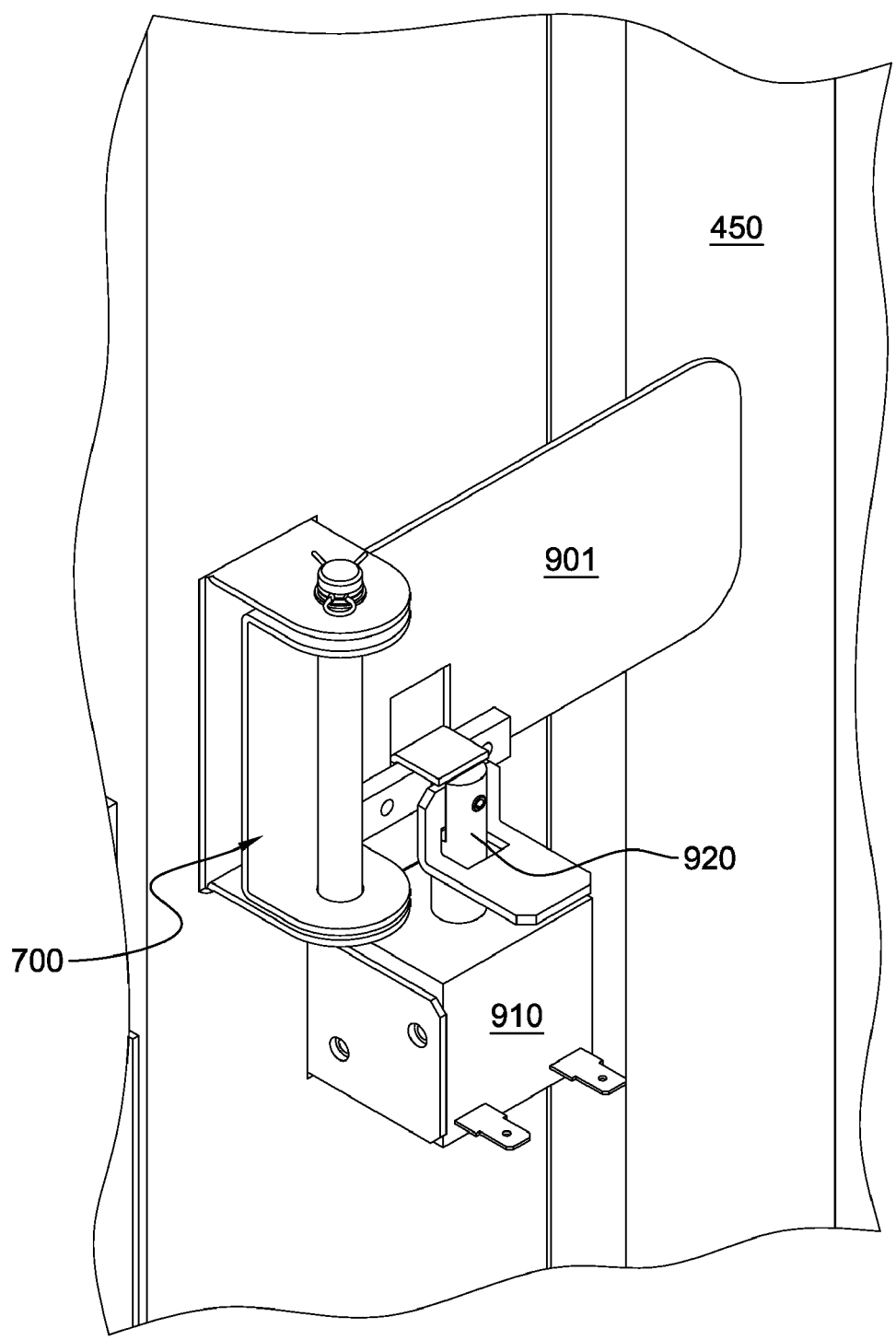
FIG. 9C is an enlarged isometric view of one embodiment of a latch mechanism for facilitating automated transition of the isolation door from the first position to the second position, in accordance with an aspect of the present invention.

FIGS. 9A-9C further illustrate operation of the isolation door and an embodiment of a latching mechanism in accordance with the apparatus depicted in FIGS. 4-8B.

In FIG. 9A, a partial depiction of airflow director 420 is shown viewed from the inside, wherein automated isolation door 450 is illustrated in its first position and is shown hingedly mounted 905 to airflow director 420 in the corner section thereof. As noted above, this hinged mounting is assumed to be spring biased such that by retracting a tab 901 of latching mechanism 700, isolation door 450 automatically swings from its first position to its second position illustrated in FIG. 9B. In the second position, isolation door 450 closes off the side section (not shown) of the airflow return pathway and simultaneously exposes the one or more exhaust openings 510 in the corner section of airflow director 420, thus allowing air to exhaust out into the data center adjacent to the air outlet side of the electronics rack.

FIG. 9C illustrates one embodiment of latching mechanism 700, in accordance with the present invention. As illustrated, latching mechanism 700 includes a rotatable tab 901 held in position by a retractable pin 920 driven by a latching solenoid 910. In one embodiment, the controller (not shown) activates latching solenoid 910 to retract retractable pin 920, thereby allowing rotatable tab 901 to rotate clockwise (in this example) due to the spring biased force of isolation door 450 pushing to transition from its first position to its second position.

Figure 10:
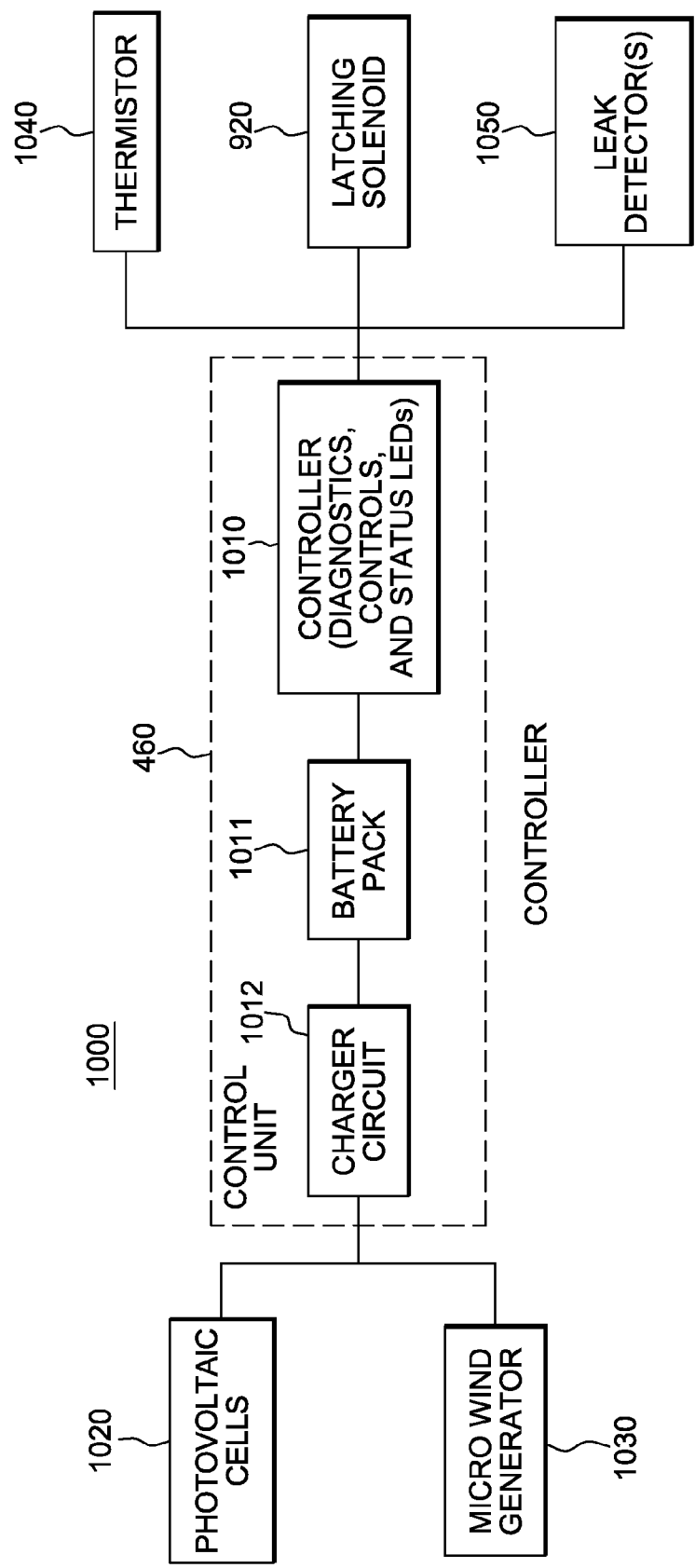
FIG. 10 is a schematic of one embodiment of a detection and control circuit for the apparatus of FIGS. 5A-9C, in accordance with an aspect of the present invention.

FIG. 10 depicts one embodiment of a detection and control circuit 1000 for the apparatus of FIGS. 5A-9C. In this embodiment, circuit 1000 is shown to include control unit 460 which comprises a controller 1010, a battery pack 1011 (powering the controller), and a charger circuit 1012 (for charging the battery pack). In one embodiment, charger circuit 1012 is passively powered by one or more passive power collectors. For example, photovoltaic cells 1020 disposed within the data center may be employed to draw power from, for example, fluorescent lighting of the data center. Additionally, one or more small, micro wind generators 1030 may be disposed within the data center, for example, within the associated electronics rack, or within the airflow return pathway. In one implementation, both types of passive power sources are employed to charge charger circuit 1012. By way of specific example, the battery pack may comprise lithium ion batteries, and the charger circuit a lithium ion battery charger.

Controller 1010 is coupled to one or more thermal sensors, for example thermistors 1040 to sense air temperature of the redirected airflow where, for example, the redirected airflow egresses to mix with air of the data center near the air inlet side of the electronics rack. Additionally, controller 1010 is connected to one or more leak detectors 1050 disposed, for example, in a pan at the bottom of the air-to-liquid heat exchange assembly for detecting a coolant leak. If either a coolant leak in the heat exchange assembly is detected or an airflow over temperature condition is noted, then controller 1010 may activate the latching solenoid to retract the retractable pin and allow the isolation door to swing from its first position to the second position, as explained above.

Figure 11:
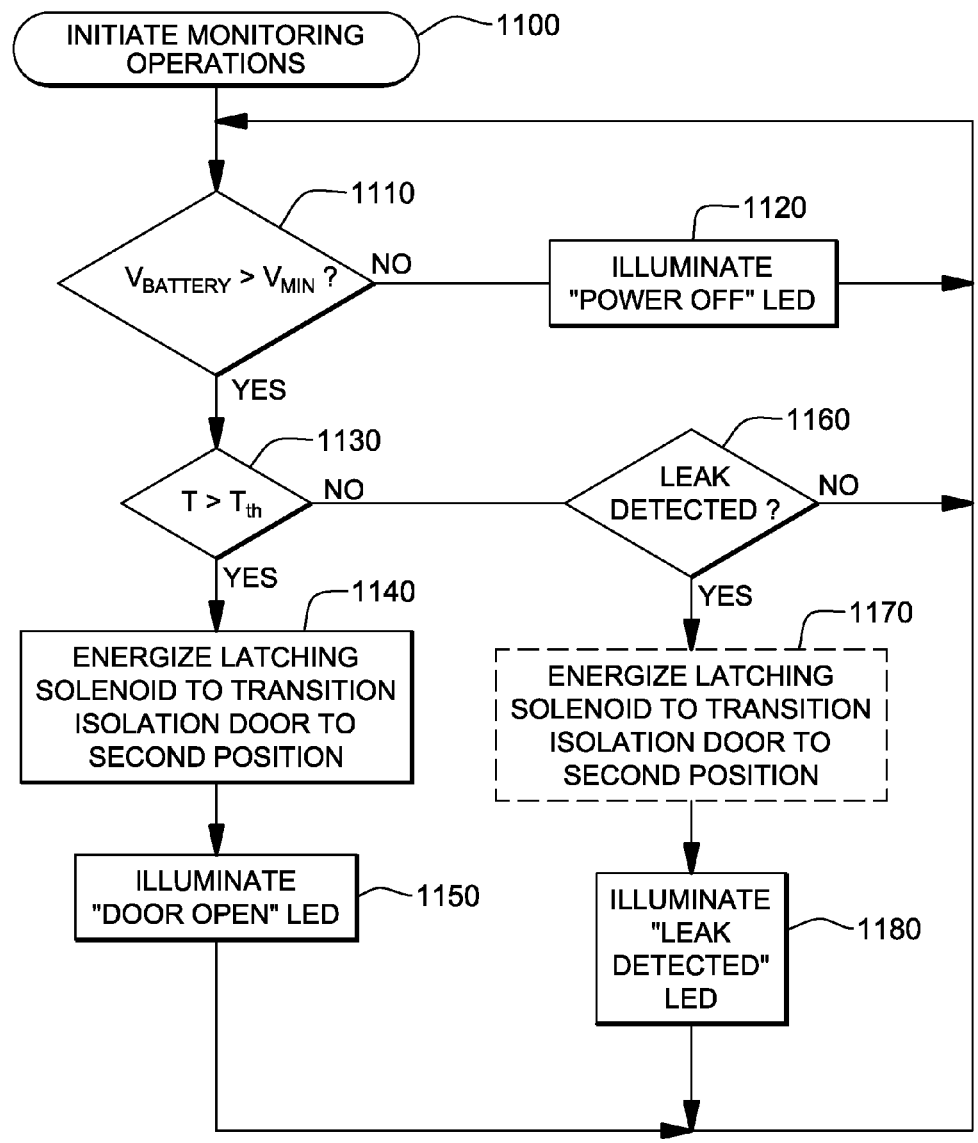
FIG. 11 is a flowchart of one embodiment of processing implemented by the controller of FIG. 10, in accordance with an aspect of the present invention.

FIG. 11 depicts one embodiment of control processing implemented by the controller. Upon initiating monitoring operation mode 1100, the controller determines whether the battery pack voltage level is above a minimum voltage ($V_{MIN}$) 1110. If "no", then the controller illuminates an associated "power off" LED 1120, indicating to a service technician that there is insufficient power to the controller. Assuming that the battery pack voltage is above the minimum threshold, then the controller determines whether the sensed temperature reading is above a temperature threshold ($T_{TH}$) 1130. If "yes", then the controller energizes the latching solenoid to transition the isolation door to its second position 1140, and illuminates a "door open" LED 1150, to indicate that the isolation door is in its second position. Assuming that the sensed air temperature is less than the threshold temperature, then the controller determines whether a leak is detected in the heat exchange assembly 1160. If "no", then the controller returns to monitor the battery pack voltage. Otherwise, the controller optionally energizes the latching solenoid to transition the isolation door to its second position 1170, and then illuminates a "leak detected" LED 1180. In an alternate implementation, the isolation door is retained in its first position notwithstanding detection of a leak until, for example, the extent of the leak exceeds a predefined threshold.

Advantageously, one skilled in the art will note from the above discussion that the control unit is passively powered in the implementations described herein. Further, multiple sources of power to the battery pack may be employed for redundancy. In one implementation, both photovoltaic cells and one or more micro wind generators may be employed to charge the battery pack. Thus, both ambient light within the data center and air movement through the electronics rack or the airflow recirculation and cooling apparatus (or elsewhere within the data center) may be employed to power the control unit. As described, the airflow recirculation and cooling apparatus disclosed herein may be employed in a conventional air-cooled raised floor data center, or in a data center lacking an air conditioning unit for a conventional air cooling of the electronics rack (e.g., where heat of the data center is removed by air-to-liquid heat exchange assemblies within the apparatuses disclosed herein).

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack of a data center, the apparatus comprising:
   an airflow director configured for the electronics rack, wherein air moves through the electronics rack from an air inlet side to an air outlet side thereof, and wherein the airflow director is configured to redirect airflow exhausting from the electronics rack at the air outlet side thereof via an airflow return pathway back towards the air inlet side of the electronics rack, wherein the airflow return pathway is configured for redirected airflow to exit the airflow return pathway into the data center to mix with air of the data center at the air inlet side of the electronics rack;
   at least one air-to-liquid heat exchange assembly disposed within the airflow return pathway for cooling redirected airflow exhausting from the air outlet side of the electronics rack before exiting into the data center to mix with air of the data center at the air inlet side of the electronics rack;
   at least one air temperature sensor for monitoring air temperature of the redirected airflow; and
   an automated isolation door associated with the airflow director for automatically blocking airflow exhausting from the air outlet side of the electronics rack from passing through the airflow return pathway back towards the air inlet side of the electronics rack responsive to temperature of the redirected airflow exceeding a defined temperature threshold.

2. The apparatus of claim 1, wherein the at least one air temperature sensor is disposed for monitoring air temperature of the redirected airflow exiting into the data center at the air inlet side of the electronics rack.

3. The apparatus of claim 1, wherein the airflow return pathway is disposed along a side of the electronics rack extending transverse to the air inlet side and the air outlet side thereof, and wherein the airflow return pathway is open to the data center at the air inlet side of the electronics rack.

4. The apparatus of claim 1, wherein the automated isolation door is disposed in a first position in normal operation with exhaust airflow from the air outlet side of the electronics rack passing through the airflow return pathway back towards the air inlet side of the electronics rack, and wherein in the first position, the automated isolation door covers at least one exhaust opening in the airflow director near the air outlet side of the electronics rack, thereby preventing exhaust airflow from the electronics rack from passing through the at least one exhaust opening in the airflow director.

5. The apparatus of claim 4, wherein the automated isolation door transitions to a second position responsive to temperature of the redirected airflow exceeding the defined temperature threshold, and wherein in the second position, the automated isolation door blocks exhaust airflow from the air outlet side of the electronics rack from passing through the airflow return pathway back towards the air inlet side of the electronics rack, and the automated isolation door in the second position allows exhaust airflow from the air outlet side of the electronics rack to pass through the at least one exhaust opening in the airflow director near the air outlet side of the electronics rack, thereby directing the exhaust airflow from the air outlet side of the electronics rack away from the air inlet side thereof.

6. The apparatus of claim 1, further comprising a controller coupled to the at least one air temperature sensor and the automated isolation door for controlling the automatic blocking of exhaust airflow from the air outlet side of the electronics rack from passing through the airflow return pathway back towards the air inlet side of the electronics rack, wherein the controller is powered by at least one passive power source.

7. The apparatus of claim 6, wherein the controller is powered by photovoltaic cells disposed within the data center.

8. The apparatus of claim 6, wherein the controller is powered by a micro wind turbine disposed within the electronics rack or within the airflow return pathway.

9. The apparatus of claim 6, wherein the controller is powered by multiple passive power sources, at least two passive power sources of the multiple passive power sources comprising different types of passive power sources.

10. The apparatus of claim 6, further comprising a leak detector associated with the at least one air-to-liquid heat exchange assembly, the controller automatically blocking airflow exhausting from the air outlet side of the electronics rack from passing through the airflow return pathway back towards the air inlet side of the electronics rack responsive to detection of a coolant leak in the at least one air-to-liquid heat exchange assembly.

11. A cooled electronics system for a data center, the cooled electronics system comprising:
   an electronics rack, the electronics rack comprising:
      an air inlet side and an air outlet side, the air inlet and air outlet sides respectively enabling ingress and egress of external air;
      at least one electronics subsystem requiring cooling; and
      at least one air moving device, the at least one air moving device causing external air to flow from the air inlet side of the electronics rack, across the at least one electronics subsystem to the air outlet side of the electronics rack; and
   an apparatus for facilitating cooling of the electronics rack, the apparatus comprising:
      an airflow director mounted to the electronics rack, wherein the airflow director redirects airflow exhausting from the electronics rack at the air outlet side thereof through an airflow return pathway back towards the air inlet side of the electronics rack, and wherein the airflow return pathway is configured for redirected airflow to exit the airflow return pathway into the data center to mix with air of the data center at the air inlet side of the electronics rack;
      at least one air-to-liquid heat exchange assembly disposed within the airflow return pathway for cooling redirected airflow exhausting from the air outlet side of the electronics rack before exiting into the data center to mix with the air of the data center at the air inlet side of the electronics rack;
      at least one air temperature sensor for monitoring air temperature of the redirected airflow; and
      an automated isolation door associated with the airflow director for automatically blocking airflow exhausting from the air outlet side of the electronics rack from passing through the airflow return pathway back towards the air inlet side of the electronics rack responsive to temperature of the redirected airflow exceeding a defined temperature threshold.

12. The cooled electronics system of claim 11, wherein the automated isolation door is disposed in a first position in normal operation with exhaust airflow from the air outlet side of the electronics rack passing through the airflow return pathway back towards the air inlet side of the electronics rack, and wherein in the first position, the automated isolation door covers at least one exhaust opening in the airflow director near the air outlet side of the electronics rack, thereby preventing exhaust airflow from the electronics rack from passing through the at least one exhaust opening in the airflow director.

13. The cooled electronics system of claim 12, wherein the automated isolation door transitions to a second position responsive to temperature of the redirected airflow exceeding the defined temperature threshold, and wherein in the second position, the automated isolation door blocks exhaust airflow from the air outlet side of the electronics rack from passing through the airflow return pathway back towards the air inlet side of the electronics rack, and the automated isolation door in the second position allows exhaust airflow from the air outlet side of the electronics rack to pass through the at least one exhaust opening in the airflow director near the air outlet side of the electronics rack, thereby directing exhaust airflow from the air outlet side of the electronics rack away from the air inlet side thereof.

14. The cooled electronics system of claim 11, further comprising a controller coupled to the at least one air temperature sensor and to the automated isolation door for controlling the automatic blocking of exhaust airflow from the air outlet side of the electronics rack from passing through the airflow return pathway back towards the air inlet side of the electronics rack, wherein the controller is powered by at least one passive power source.

15. The cooled electronics system of claim 14, wherein the controller is powered by at least one of photovoltaic cells disposed within the data center or a micro wind turbine disposed within the electronics rack or within the airflow return pathway.

16. The cooled electronics system of claim 14, wherein the controller is powered by multiple passive power sources, at least two passive power sources of the multiple passive power sources comprising different types of passive power sources.

17. The cooled electronics system of claim 11, wherein the at least one air temperature sensor is disposed for monitoring air temperature of the redirected airflow exiting into the data center at the air inlet side of the electronics rack.

18. A method of facilitating cooling of an electronics rack, the method comprising:
providing an airflow director configured for the electronics rack, wherein air moves through the electronics rack from an air inlet side to an air outlet side thereof, and wherein the airflow director is configured to redirect airflow exhausting from the electronics rack at the air outlet side thereof via an airflow return pathway back towards the air inlet side of the electronics rack, wherein the airflow return pathway is configured for redirecting airflow to exit the airflow return pathway into the data center to mix with air of the data center at the air inlet side of the electronics rack;

disposing at least one air-to-liquid heat exchange assembly within the airflow return pathway for cooling redirected airflow from the air outlet side of the electronics rack before exiting into the data center to mix with air of the data center at the air inlet side of the electronics rack;

providing at least one air temperature sensor for monitoring air temperature of the redirected airflow; and mounting an automated isolation door to the airflow director for automatically blocking airflow exhausting from the air outlet side of the electronics rack from passing through the airflow return pathway back towards the air inlet side of the electronics rack responsive to temperature of the redirected airflow exceeding a defined temperature threshold.

19. The method claim 18, wherein the automated isolation door is disposed in a first position in normal operation with exhaust airflow from the air outlet side of the electronics rack passing through the airflow return pathway back towards the air inlet side of the electronics rack, and wherein in the first position, the automated isolation door covers at least one exhaust opening in the airflow director near the air outlet side of the electronics rack, thereby preventing exhaust airflow from the electronics rack from passing through the at least one exhaust opening in the airflow director.

20. The method claim 19, wherein the automated isolation door transitions to a second position responsive to temperature of the redirected airflow exceeding the defined temperature threshold, and wherein in the second position, the automated isolation door blocks exhaust airflow from the air outlet side of the electronics rack from passing through the airflow return pathway back towards the air inlet side of the electronics rack, and the automated isolation door in the second position allows exhaust airflow from the air outlet side of the electronics rack to pass through the at least one exhaust opening in the airflow director near the air outlet side of the electronics rack, thereby directing the exhaust airflow from the air outlet side of the electronics rack away from the air inlet side thereof.

* * * * *